US006951468B1

(12) United States Patent
Greco

(10) Patent No.: US 6,951,468 B1
(45) Date of Patent: Oct. 4, 2005

(54) LAPTOP STORAGE CABINET

(76) Inventor: David F. Greco, 68 Shingle Mill Rd., Harwinton, CT (US) 06791

(*) Notice: Subject to any disclaimer, the term of this patent is extended or adjusted under 35 U.S.C. 154(b) by 171 days.

(21) Appl. No.: 10/382,950

(22) Filed: Mar. 6, 2003

Related U.S. Application Data

(60) Provisional application No. 60/399,341, filed on Jul. 29, 2002, and provisional application No. 60/362,116, filed on Mar. 6, 2002.

(51) Int. Cl.[7] .......................... H01R 13/44; H01R 13/60
(52) U.S. Cl. ...................................... 439/131; 312/236
(58) Field of Search ........................... 312/236; 439/131

(56) References Cited

U.S. PATENT DOCUMENTS

| 5,611,553 | A | * | 3/1997 | Schoeman et al. | ....... 280/47.35 |
|---|---|---|---|---|---|
| 6,008,621 | A | * | 12/1999 | Madison et al. | ............ 320/107 |
| 6,185,098 | B1 | * | 2/2001 | Benavides | .................. 361/695 |
| 6,283,429 | B1 | * | 9/2001 | Markovich et al. | ...... 248/286.1 |
| 6,336,691 | B1 | * | 1/2002 | Maroney et al. | ............ 312/236 |
| 6,621,692 | B1 | * | 9/2003 | Johnson et al. | ............. 361/683 |

* cited by examiner

Primary Examiner—Hae Moon Hyeon
(74) Attorney, Agent, or Firm—Jagtiani + Guttag

(57) ABSTRACT

A cabinet for storing electronic computing devices including laptop computers and electronic testing equipment, wherein the cabinet includes lockable drawers having a back wall for receiving coiled power cords and coiled data connection cords from a power strip located at the inside of the back panel of the cabinet. There is one coiled power cord extending to each drawer of the cabinet, and at least one coiled data connection cord extending to each drawer of the cabinet.

14 Claims, 5 Drawing Sheets

LAPTOP STORAGE CABINET

This application claims benefit of Provisional Application Nos. 60/362,116 filed Mar. 6, 2002 and 60/399,341 filed Jul. 29, 2002.

FIELD OF INVENTION

The present invention is directed generally to a cabinet for storing laptop computers and electronic test equipment; and more particularly to a storage cabinet having easy access power outlets and data connections for each electronic device stored in the cabinet.

BACKGROUND OF INVENTION

Persons and companies who use multiple laptop computers and electronic testing equipment often require a safe and organized way of storing the electronic devices while the connected to a power source and data connection. Previous inventions in this area offer vented cabinets with power strips, having the power source inside the back of the cabinet and a wire management system allowing connection of the computers to the power strip. This is not an optimal configuration because the location of the power strips and wire management are not user-friendly. Further, previous cabinets do not provide for cabinet adjustment to suit the needs of the user.

The present invention overcomes the problems of electronic equipment storage cabinets.

SUMMARY OF INVENTION

The present invention is directed to a cabinet for storing electronic computing devices such as laptop computers and electronic testing equipment that includes lockable drawers having a back wall for receiving power cords and data connections from a power strip located at the inside of the back panel of the cabinet. There is one coiled power cord extending to each drawer of the cabinet, and at least one coiled data connection cord extending to each drawer of the cabinet.

DETAILED DESCRIPTION OF INVENTION

Figure 1:
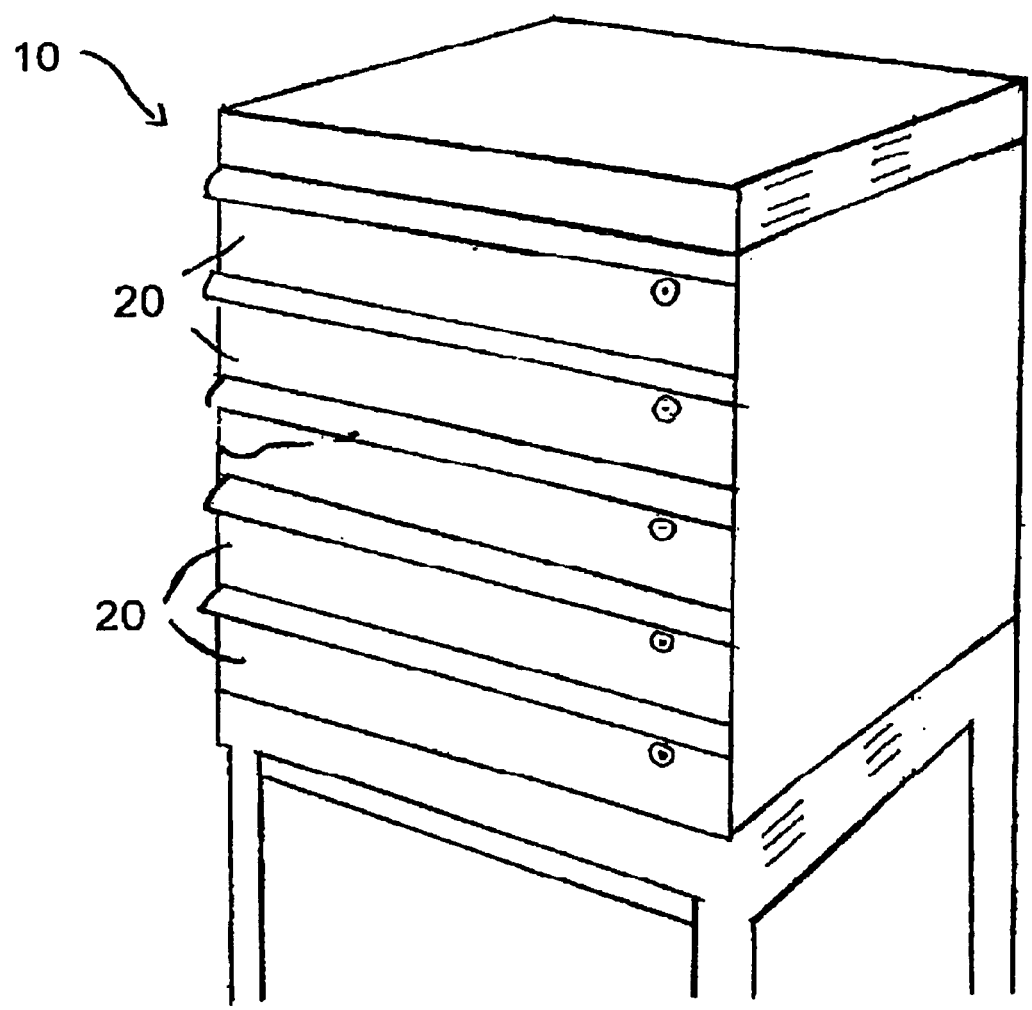
FIG. 1 is a schematic view of a fully assembled laptop storage cabinet.

While the storage cabinet of the present invention can be used to store laptop computers and other electronic test equipment requiring power outlets and data connections, for simplicity the invention will be discussed in terms of laptop computers. This is not intended to limit the scope of the invention. A laptop computer storage cabinet 10 is disclosed herein as shown in FIG. 1. The laptop cabinet is designed to safely store laptop computers in an organized fashion. The laptop cabinet includes a base panel, a back panel, two side panels, and a top panel. The back panel and two side panels extend between and connect the base panel and top panel. The structure formed by the panels leaves an open front portion and interior for receiving at least one, but preferably multiple drawers. The laptop cabinet preferably includes five drawers 20 as shown in FIG. 1, but can include any number of drawers practical for the user. Each drawer is lockable and has at least one data connection and at least one three prong grounded power outlet at the back of the drawer.

Figure 2:
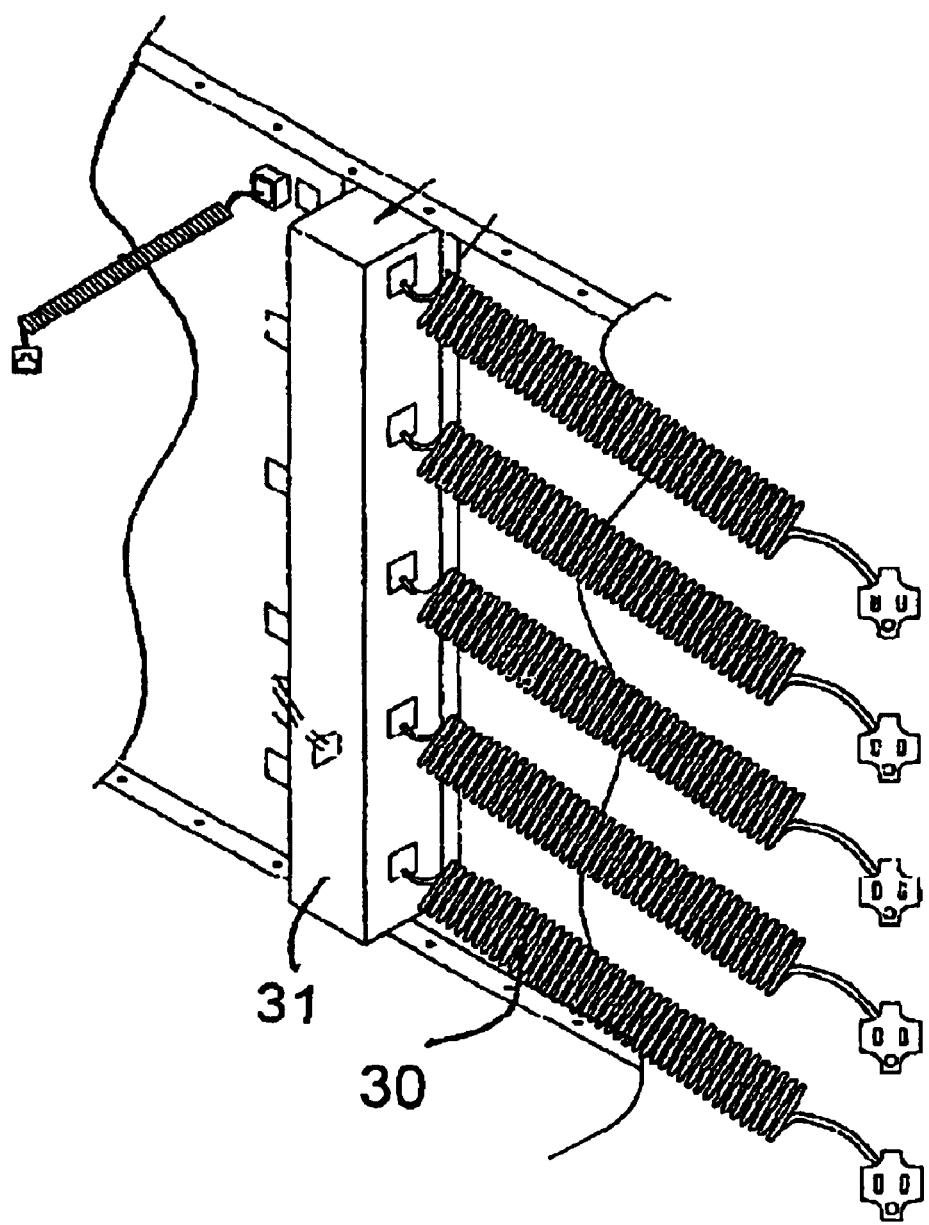
FIG. 2 is a schematic view of a power strip with multiple coiled power cords and data connections.
Figure 3:
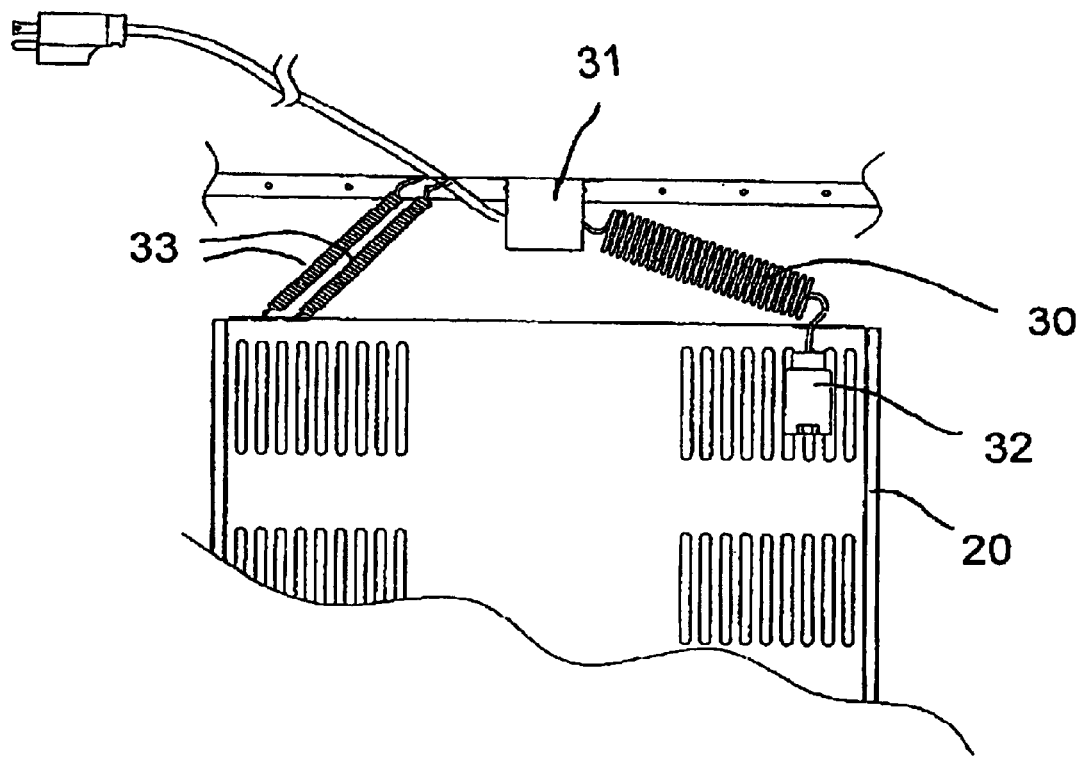
FIG. 3 is a top view of the rear of a drawer and laptop cabinet with a coiled power cord and coiled data connections.
Figure 5:
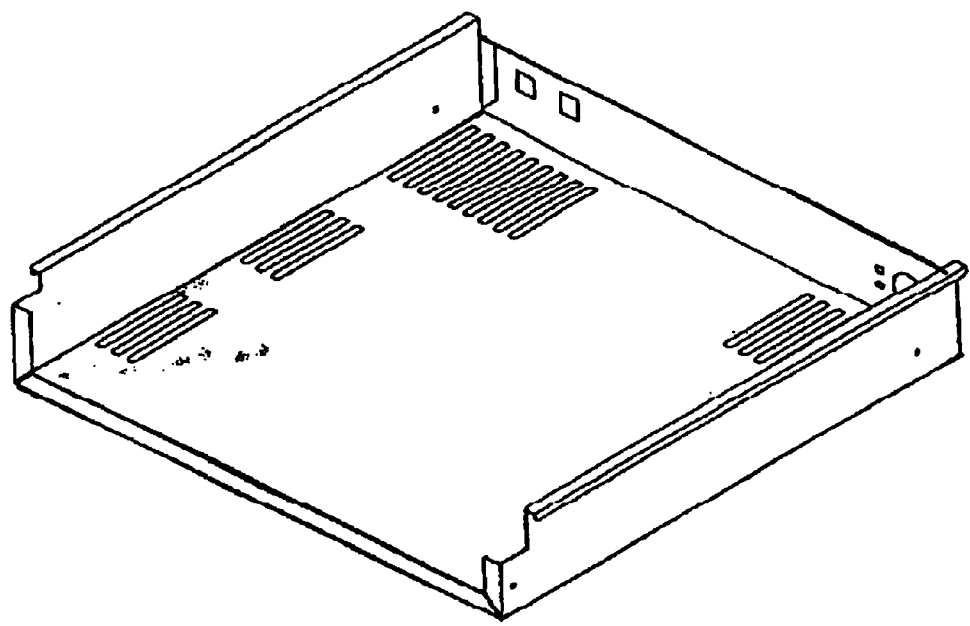
FIG. 5 is a schematic view of a drawer for the laptop cabinet.

The power is provided to the back of each drawer by a coiled power cord 30 as shown in FIG. 2. A power strip 31 is mounted in the interior of the cabinet at the inside back panel and includes a coiled extension cord for each drawer in the cabinet. The power strip has one cord going out to be plugged into a power source and has at least one coiled cords extending to the power connection 32 at the back of each drawer as shown in FIG. 3. As illustrated in FIG. 3, the power connection 32 at the back of the drawer is displaced from the power strip 31 by a distance greater than the length of the coiled cord 30. This displacement allows for the drawer to be opened without losing connection while at the same time keeping the cords stored in an untangled space efficient manner. The data connection is supplied to each drawer by at least one coiled data cord 33 shown in FIG. 3. Also as shown in FIG. 3, each coiled data cord 33 has one end attached to the data connection and another end passing through an opening in the back panel of the cabinet. As with the coiled power cord, the data connection is displaced from the opening in the back panel by a distance greater than the length of the coiled data cords. The coiled data cords of the present invention are preferably comprised of Category 5, Category 5E, or Category 6 wires. When the drawer is opened and closed, the coiled cords expand and contract thereby preventing the connections from being pulled loose. Each drawer contains small vents to allow air circulation and at least two holes at the back of each drawer, as shown in FIG. 5. The back of the drawer preferably includes three holes, one for the power cord, and two for data connection cords.

Figure 4:
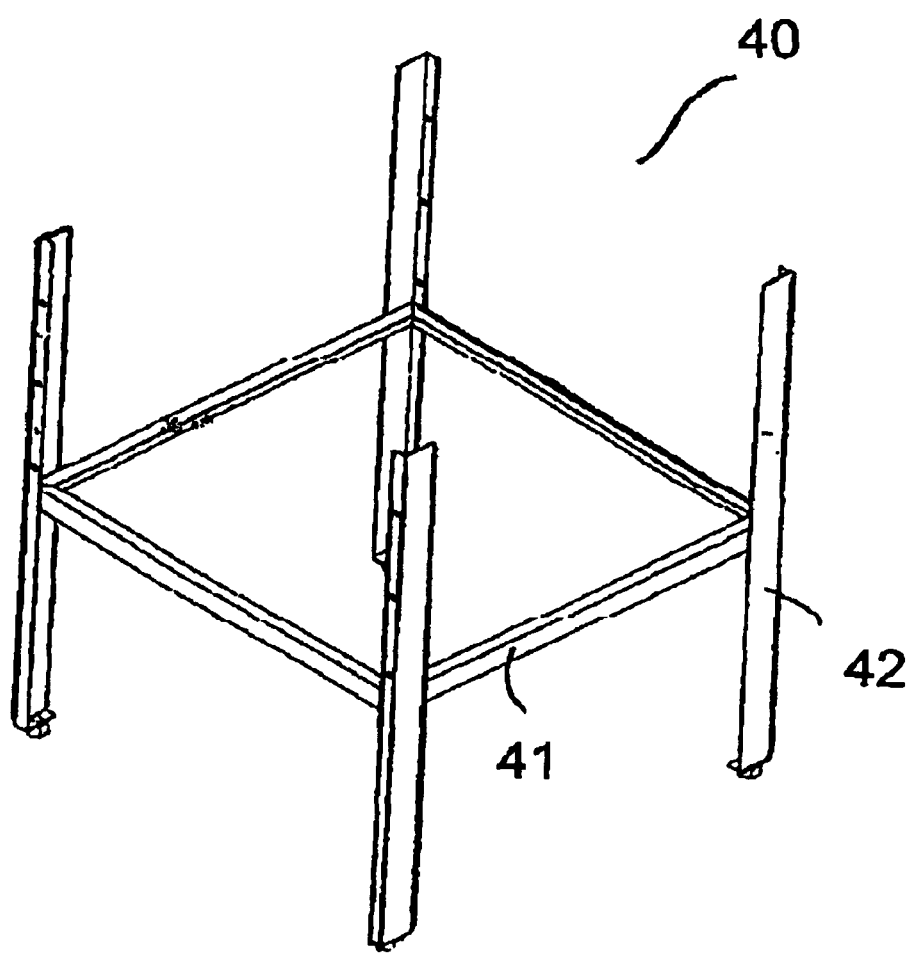
FIG. 4 is a schematic view of an adjustable internal stand.

In a preferred embodiment, the laptop cabinet also includes an adjustable internal stand 40 as shown in FIG. 4. This internal adjustable stand enables the laptop cabinet to be adjusted to different heights. Preferably, the laptop cabinet is adjustable to a height of about 12 inches, 16 inches, or 20 inches from the ground. However, the internal adjustable stand could be manufactured to permit various cabinet heights other than preferred heights set forth above.

The internal adjustable stand preferably includes a frame 41 for supporting the laptop cabinet and a plurality of legs 42 supporting the frame as shown in FIG. 4. Preferably the stand includes four legs, one at each corner of the base frame. Each leg has three holes for receiving screws or bolts, and each hole corresponds to a height to make the bottom of the cabinet about 12, 16, or 20 inches from the ground. To adjust the height, the user simply removes the bolts or screws from the legs, adjusts the stand to the desired height, and replaces the bolts or screws. The internal adjustable stand can also be completely removed from the laptop cabinet, thereby allowing the bottom of the laptop cabinet to rest on the ground or on top of another laptop cabinet or other desired surface.

What is claimed is:

1. A cabinet for storing electronic computing devices comprising:

a base and a top panel;

one back panel and two side panels extending between and connecting said base and said top panel;

an open front and interior for receiving at least one drawer, said at least one drawer having a front, a back, two sides, and a floor;

at least one data connection within the back of said at least one drawer;

at least one data cord opening within the back panel of said cabinet;

at least one coiled data connection cord having a first end and a second end, said first end attached said at least one data connection and said second end extending through said at least one data cord opening, said at least one data connection displaced from said data cord opening by a distance greater than the length of said coiled data connection cord;

a three pronged grounded power outlet within the back of said at least one drawer;

a power strip mounted within said cabinet interior at said back panel, said power strip having one cord connecting with an external power source and at least one coiled power cord extending from said power strip to said grounded power outlet within at least one drawer, said power strip displaced from said grounded power outlet by a distance greater than the length of said coiled power cord; and at least one air vent within said at least one drawer;

wherein, an electronic computing device can be securely stored and provided with a power supply and data connection within each of said at least one drawer;

wherein, said at least one coiled power cord and coiled data connection cord expand and contract when said at least one drawer is opened and closed.

2. The cabinet of claim 1, wherein said electronic computing device is a laptop computer.

3. The cabinet of claim 1, wherein said electronic computing device is electronic test equipment.

4. The cabinet of claim 1, wherein said coiled data connection cord is chosen from the group comprising Category 5, Category 5E, and Category 6 wire.

5. The cabinet of claim 1, further comprising an internal adjustable stand comprising a frame configured to receive said base of said cabinet and a plurality of vertical support legs adjustably attached to said frame, each of said support legs having multiple mounting holes spanning their entire length, wherein said frame attaches to each of said support legs at one of said multiple mounting holes at a position above ground level, wherein said support legs extend vertically into said interior of said cabinet, and wherein a height of said cabinet can be adjusted by adjusting said position of the frame on said support bars.

6. The cabinet of claim 2, wherein said cabinet is adjustable to a height of about 12 to 20 inches from ground level.

7. The cabinet of claim 1, wherein said at least one drawer is lockable.

8. The cabinet of claim 5, wherein said plurality of vertical support legs is at least four vertical support legs.

9. A laptop computer storage cabinet comprising:

a base and a top panel;

one back panel and two side panels extending between and connecting said base and said top panel;

an open front and interior for receiving at least one drawer, said at least one drawer having a front, a back, two sides, and a floor;

at least one data connection within the back of said at least one drawer;

at least one data cord opening within the back panel of said cabinet;

at least one coiled data connection cord having a first end and a second end, said first end attached said at least one data connection and said second end extending through said at least one data cord opening, said at least one data connection displaced from said data cord opening by a distance greater than the length of said coiled data connection cord;

a three pronged grounded power outlet within the back of said at least one drawer;

a power strip mounted within said cabinet interior at said back panel, said power strip having one cord connecting with an external power source and at least one coiled power cord extending from said power strip to said grounded power outlet within at least one drawer, said power strip displaced from said grounded power outlet by a distance greater than the length of said coiled power cord; and at least one air vent within said at least one drawer;

wherein, a laptop computer can be securely stored and provided with a power supply and data connection within each of said at least one drawer;

wherein, said at least one coiled power cord and coiled data connection cord expand and contract when said at least one drawer is opened and closed.

10. The laptop computer storage cabinet of claim 9, wherein said coiled data connection cord is chosen from the group comprising Category 5, Category 5E, and Category 6 wire.

11. The laptop computer storage cabinet of claim 9, further comprising an internal adjustable stand comprising a frame configured to receive said base of said cabinet and a plurality of vertical support legs adjustably attached to said frame, each of said support legs having multiple mounting holes spanning their entire length, wherein said frame attaches to each of said support legs at one of said multiple mounting holes at a position above ground level, wherein said support legs extend vertically into said interior of said cabinet, and wherein a height of said cabinet can be adjusted by adjusting said position of the frame on said support bars.

12. The laptop computer storage cabinet of claim 9, wherein said cabinet is adjustable to a height of about 12 to 20 inches from ground level.

13. The laptop computer storage cabinet of claim 9, wherein said at least one drawer is lockable.

14. The laptop computer storage cabinet of claim 9, wherein said at least one drawer is lockable.

* * * * *